(12) United States Patent
Zhu et al.

(10) Patent No.: US 8,729,638 B2
(45) Date of Patent: May 20, 2014

(54) METHOD FOR MAKING FINFETS AND SEMICONDUCTOR STRUCTURES FORMED THEREFROM

(75) Inventors: Huilong Zhu, Poughkeepsie, NY (US); Zhijiong Luo, Poughkeepsie, NY (US); Haizhou Yin, Poughkeepsie, NY (US)

(73) Assignee: Institute of Microelectronics, Chinese Academy of Sciences, Beijing, P.R. (CN)

( * ) Notice: Subject to any disclaimer, the term of this patent is extended or adjusted under 35 U.S.C. 154(b) by 0 days.

(21) Appl. No.: 13/696,071

(22) PCT Filed: Nov. 30, 2011

(86) PCT No.: PCT/CN2011/002004
§ 371 (c)(1),
(2), (4) Date: Nov. 3, 2012

(87) PCT Pub. No.: WO2013/044430
PCT Pub. Date: Apr. 4, 2013

(65) Prior Publication Data
US 2013/0146942 A1 Jun. 13, 2013

(30) Foreign Application Priority Data

Sep. 28, 2011 (CN) .......................... 2011 1 0295189

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl.
USPC 257/369; 257/382; 257/E27.06; 257/E27.062

(58) Field of Classification Search
CPC ............ H01L 27/0886; H01L 27/0924; H01L 27/10826; H01L 27/10879; H01L 27/1211; H01L 29/785
USPC .................... 257/368, 369, 382, 384, E27.06, 257/E27.062
See application file for complete search history.

(56) References Cited

U.S. PATENT DOCUMENTS

| 2011/0079829 A1* | 4/2011 | Lai et al. ................. 257/288 |
| 2011/0121406 A1 | 5/2011 | Lee et al. |
| 2011/0198676 A1 | 8/2011 | Luo et al. |

FOREIGN PATENT DOCUMENTS

| CN | 101060136 A | 10/2007 |
| CN | 101604705 A | 12/2009 |

OTHER PUBLICATIONS

International Search Report (in Chinese).
Written Opinion (in Chinese).

* cited by examiner

*Primary Examiner* — Hoai V Pham
(74) *Attorney, Agent, or Firm* — Goodwin Procter LLP

(57) ABSTRACT

A method for making FinFETs and semiconductor structures formed therefrom is disclosed, comprising: providing a SiGe layer on a Si semiconductor substrate and a Si layer on the SiGe layer, wherein the lattice constant of the SiGe layer matches that of the substrate; patterning the Si layer and the SiGe layer to form a Fin structure; forming a gate stack on top and both sides of the Fin structure and a spacer surrounding the gate stack; removing a portion of the Si layer which is outside the spacer with the spacer as a mask, while keeping a portion of the Si layer which is inside the spacer; removing a portion of the SiGe layer which is kept after the patterning, to form a void; forming an insulator in the void; and epitaxially growing stressed source and drain regions on both sides of the Fin structure and the insulator.

8 Claims, 15 Drawing Sheets

METHOD FOR MAKING FINFETS AND SEMICONDUCTOR STRUCTURES FORMED THEREFROM

CROSS REFERENCE

This application is a National Phase application of, and claims priority to, PCT Application No. PCT/CN2011/002004, filed on Nov. 30, 2011, entitled "Method for Making FinFETs and Semiconductor Structures Formed Therefrom," which claimed priority to Chinese Application No. CN 201110295189.8, filed on Sep. 28, 2011. Both the PCT Application and Chinese Application are incorporated herein by reference in their entireties.

FIELD OF THE INVENTION

The invention relates to the semiconductor field, and in particular, relates to a method for making FinFETs (Fin Field-Effect Transistor) and semiconductor structures formed therefrom.

BACKGROUND OF THE INVENTION

As the semiconductor industry advances to the 22 nm technology node, some manufacturers have already begun to consider the problem of how to make transition from a planar CMOS transistor to a three-dimensional (3D) FinFET device structure. Compared to a planar transistor, a FinFET device improves control over the channel, and thus reduces short-channel effect. The gate of a planar transistor is located right over the channel, while the gate of a FinFET device surrounds the channel from two or three sides, thus electrostatic control may be implemented for the channel from two or three sides.

At present, normally there are two types of conventional FinFETs: FinFETs formed on a substrate of a Silicon-On-Insulator (SOI), and FinFETs formed on a substrate of a bulk Si material (Bulk FinFETs). However, using of SOI wafers to make FinFETs is very expensive. In another aspect, it is difficult to make high-quality FinFETs with conventional bulk wafers due to the problems in terms of device width and sub-threshold leakage control.

SUMMARY OF THE INVENTION

The structure and method disclosed by the invention relate to making a FinFET with conventional wafer. The FinFET of the invention has as good performance in control of device width and sub-threshold leakage as the FinFET made by use of a SOI.

In order to realize the objective, according to an aspect of the invention, a method for making a Fin Field-Effect Transistor is provided, comprising: providing a semiconductor substrate, a SiGe layer on the semiconductor substrate and a Si layer on the SiGe layer, wherein the lattice constant of the SiGe layer matches with that of the substrate; patterning the Si layer and the SiGe layer to form a Fin structure; forming a gate stack on top and both sides of the Fin structure and a spacer surrounding the gate stack; removing a portion of the Si layer which is outside the spacer with the spacer as a mask, while keeping a portion of the Si layer which is inside the spacer; removing a portion of the SiGe layer which is kept after the patterning, to form a void; forming an insulator in the void; and epitaxially growing stressed source and drain regions located on both sides of the Fin structure and the insulator.

According to another aspect of the invention, a semiconductor structure is provided, comprising: a semiconductor substrate; an insulator formed on the semiconductor substrate; a Fin structure formed over the insulator; a gate stack and a spacer surrounding the gate stack, which are formed over the Fin structure; and source and drain regions located on both sides of the Fin structure and the insulator, wherein, the source and drain regions are formed of a stressed material for enhancing the carrier mobility of the channel.

Besides the advantages mentioned above, the invention further has advantageous effect as follows:

the FinFET may be formed by a bulk semiconductor substrate, such that the device width can be easily adjusted; the insulator increases the distance between the gate and the source/drain, such that the parasitic capacitance may be reduced; the area of the source/drain increases, such that the source/drain resistance may be reduced; spacing regions are formed between the source and drain, such that the SCE (Short Channel Effect) may be reduced; the stressed source/drain may enhance the strain of a channel.

BRIEF DESCRIPTION OF THE DRAWINGS

Through the following discussion on the embodiment of the invention with reference to the Figures, the aforesaid and other objectives, the characteristics and the advantages of the invention will be clearer. In the Figures.

It shall be noted that the Figures of the Description are not drawn to scale, instead, they are only for the purpose of illustration, thus, they shall not be taken as any limitation and constraint to the scope of the invention. In the Figures, similar components are identified by similar reference signs.

DETAILED DESCRIPTION OF THE EMBODIMENTS

In the following text, the invention is discussed through a specific embodiment shown in the Figures. However, it shall be appreciated that the discussion is only exemplary, rather than limiting the scope of the invention. Besides, in the following illustration, the discussion on the commonly known structure and technique are omitted to avoid unnecessary confusion with the concepts of the invention.

The Figures show schematic diagrams of the layered structure according to the embodiment of the invention. These Figures are not drawn to scale, wherein some details are enlarged and some details may be omitted for the purpose of clarity. The various regions and layers shown in the Figures are only exemplary in shape and in the relationship therebetween as to relative size and location, practically, there may be deviation due to manufacture tolerance or technique limitation, moreover, those having ordinary skill in the art may further design regions/layers of different shapes, sizes and relative locations in accordance with practical demand.

Figure 1:
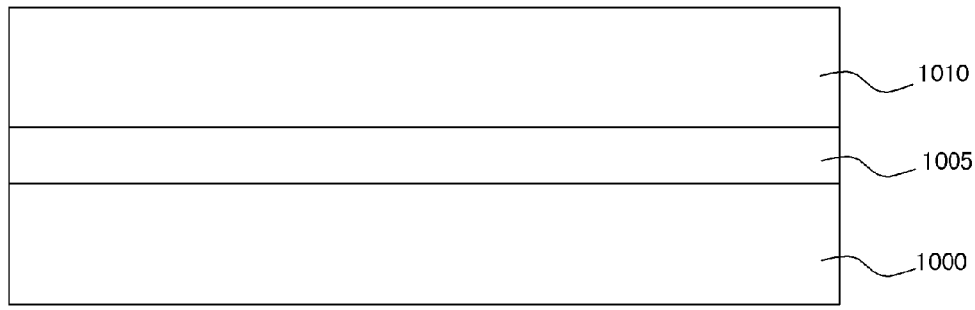
FIGS. 1, 2$a$-2$b$, 3, 4$a$-4$b$, 5, 6$a$-6$b$, 7$a$-7$b$, 8$a$-8$c$, 9$a$-9$b$, 10, 11$a$-11$b$, 12$a$-12$b$, 13$a$-13$b$, 14$a$-14$b$, 15$a$-15$c$, 16$a$-16$c$, 17$a$-17$b$, 18$a$-18$c$ and 19$a$-19$c$ illustrate the intermediate structure in the manufacturing method flow according to the embodiment of the invention.

In FIG. 1, a bulk substrate 1000 made from a bulk semiconductor material is provided, for example, the material for forming the semiconductor substrate 1000 may comprise bulk Si. Of course, those having ordinary skill in the art also may think of other different materials, such as Ge, and so on. Using a conventional bulk wafer in the invention can reduce cost compared to using a SOI substrate. The bulk substrate further may be doped by implantion, preferably, in the case where the device made is an NFET, boron (B) or BF2 may be used as dopant, the concentration thereof is about $1\times10^6$-$1\times10^{19}$/cm$^3$; in the case where the device made is a PFET, phosphate (P) or arsenic (As) may be used, the concentration thereof is about $1\times10^6$-$1\times10^{19}$/cm$^3$. The purpose of implantation is to form a punch-through blocking layer in the bulk Si to prevent punch-through with the source and drain regions in the subsequent steps which thus forms another device. The thickness of the substrate may be set freely as long as the mechanical strength thereof is sufficient to support the wafer.

Refer to FIG. 1, next, a first layer 1005 having etching selectivity relative to the substrate is formed on the semiconductor substrate and the first layer is stressed to provide a lattice constant that matches with that of the substrate. If the semiconductor substrate is Si, a SiGe layer 1005 (e.g. 10-30 nm thick, Ge % is about 5-15%) may be epitaxially grown to serve as the first layer. In another embodiment, a SiGe layer 1005 can be formed by the following steps: Ge implantation on a conventional Si semiconductor substrate and high temperature annealing, forming a buried SiGe layer in the Si substrate.

On the first layer 1005, a second layer 1010 having the same material as the substrate is formed opposite to the semiconductor substrate 1000, the thickness of the material corresponds to a desired height of the Fin structure in the subsequent steps. For example, if the substrate is Si, the epitaxial Si, for example, has a thickness of 30-100 nm.

Figure 2A:
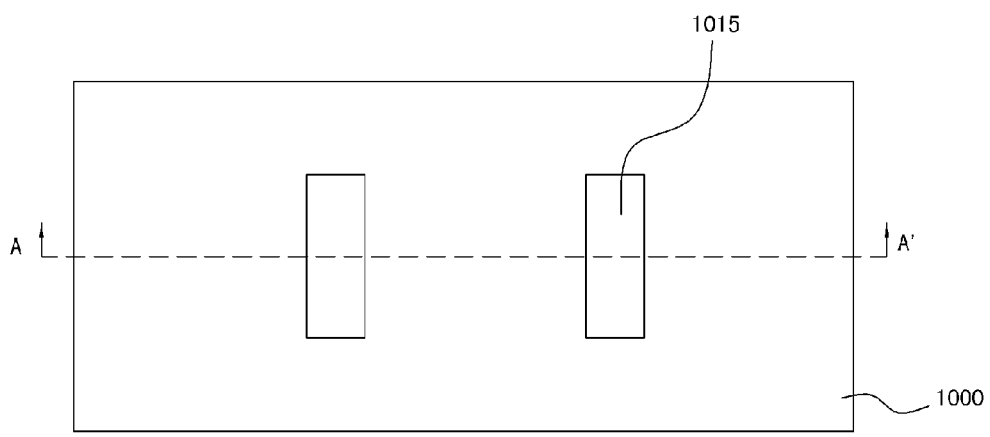
Figure 2B:
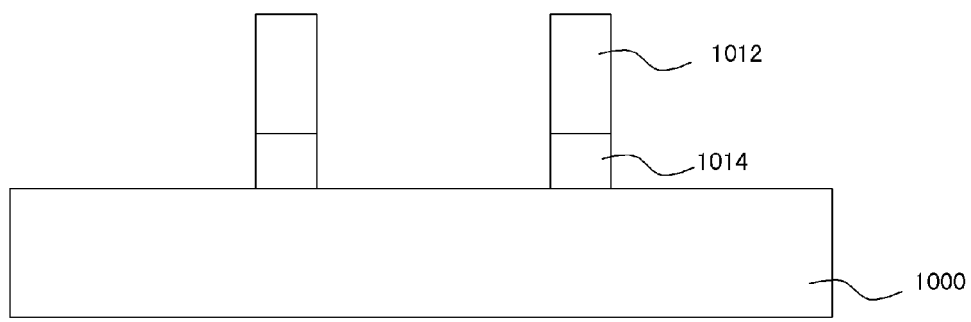

Next, a first photo-resist material layer is formed on the obtained structure and is patterned with a conventional process to form a desired pattern of the Fin structure. Thereafter, a portion of the second layer and a portion of the first layer that are not beneath the first photo-resist material layer are removed, while a first portion 1012 of the second layer and a first portion 1014 of the first layer that are masked by the first photo-resist material layer are kepted. The process of removing the second layer and the first layer, for example, comprises but is not limited to reactive-ion etching (RIE), dry etching or the combination thereof In the instance where the second layer is Si and the first layer is SiGe, preferably, removing of the Si 1010 is by use of an etching process that is selective to Si material, and removing of the SiGe 1005 is by use of an etching process that is selective to SiGe material, the etching stops on the Si bulk substrate, the first photo-resist material layer is removed. The first portion 1012 of the second layer 1010 on the semiconductor substrate 1000 constitutes a Fin structure 1015. The height of the Fin represents the channel width of the device, thus the channel width of the device can be easily adjusted. The width of the Fin preferably is within the range of 20-40 nm, as shown in FIGS. 2a-2b, wherein, FIG. 2a is the top view, and FIG. 2b is a cross-sectional view taken along the line A-A' in FIG. 2a.

Figure 3:
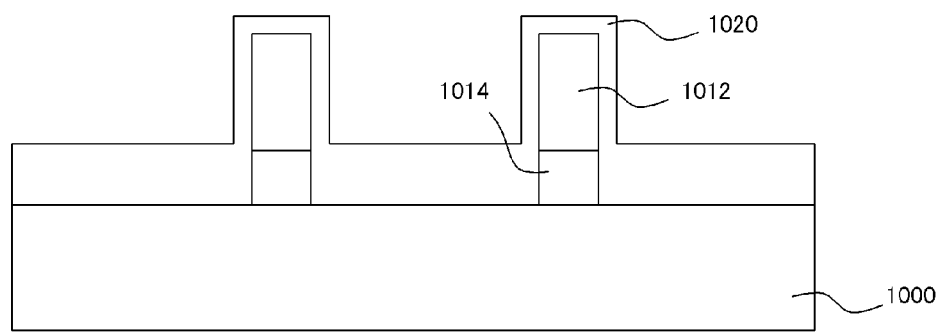

Next, a first insulating material layer 1020 is formed on top of the bulk substrate 1000 and the Fin structure 1015, preferably, the first insulating material layer 1020 is deposited by using the high-density plasma (HDP) deposition technique. The thickness of the first insulating material layer on the top of the bulk substrate is within the range of 20-40 nm. The obtained thickness of the first insulating material layer on the sidewalls of the Fin structure is thinner than that on the top of the bulk substrate due to sputtering effect. In addition, the thickness of the first insulating material layer on the top of the Fin structure is also thinner than that on the top of the bulk substrate. The material for the first insulating material layer comprises but is not limited to oxide, nitride or the combination thereof FIG. 3 is a cross-sectional view taken along the line A-A' in FIG. 2a after the deposition.

Figure 4A:
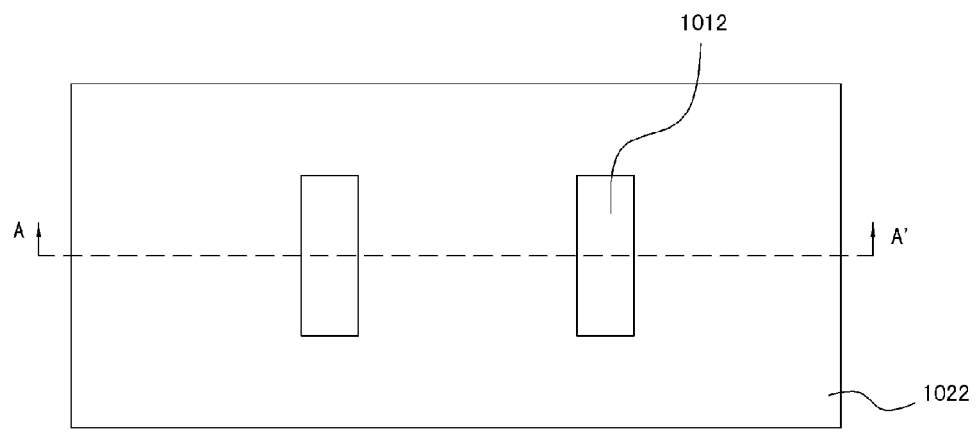
Figure 4B:
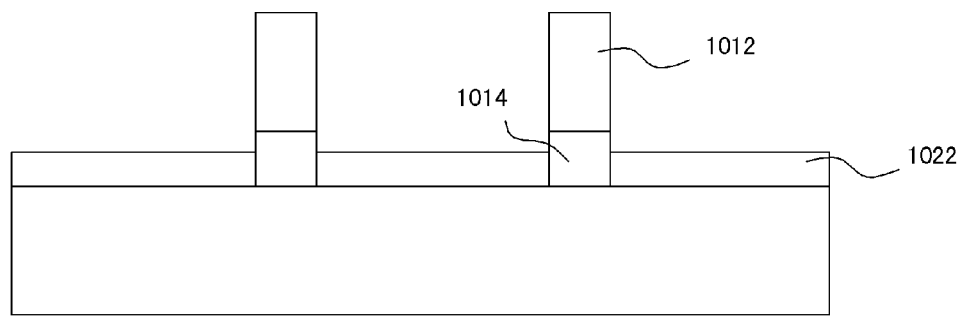

After the HDP, the first insulating material layer on the sidewalls and the top of the Fin structure is removed, while a first portion 1022 of the first insulating material layer 1020 of certain thickness on the top of the bulk substrate is kepted. This can be done by using the isotropic etching technique which is selective to the first insulating material layer 1020. Preferably, the height of the kepted first portion 1022 of the first insulating material layer 1020 is between the bottom of the Fin structure 1015 and the top of the bulk substrate, that is, the etching stops in the first layer 1005. FIG. 4a is the top view, and FIG. 4b is a cross-sectional view taken along the line A-A'.

Figure 5:
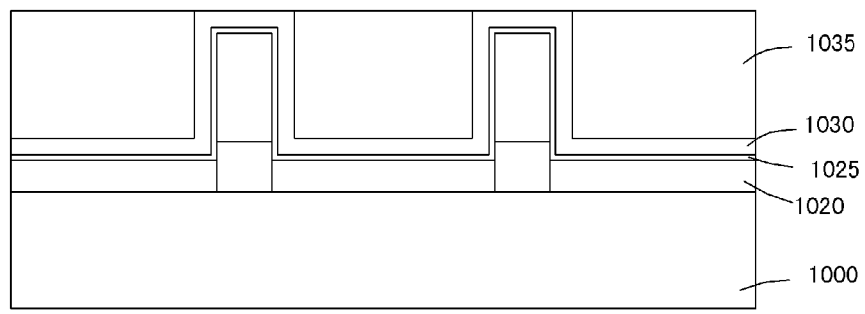

Refer to FIG. 5, a gate insulating material layer 1025 is formed on top and sidewalls of the Fin structure 1015 and on the first portion 1022 of the first insulating material layer 1020. The instance of the process of forming the gate insulating material layer 1025 comprises but is not limited to depositing a high-K dielectric material using the process of low pressure chemical vapor deposition, metal-organic chemical vapor deposition or atomic layer deposition, etc., wherein, the high-K dielectric material 1025, for example, is $HfO_2$, SiON, HfAlON, HfTaON, HfSiON, $Al_2O_3$ or combinations thereof, it preferably is $HfO_2$ in the embodiment of the invention, the equivalent oxide thickness of the gate insulating material layer 1025 is about 2-5 nm.

Continue to refer to FIG. 5, a gate metal layer 1030 is deposited on the formed structure. The instance of the process of forming the gate metal layer 1030 comprises but is not limited to chemical vapor deposition. The material for the gate metal layer 1030 preferably is TiN, the thickness thereof is about 3-10 nm.

Next, a poly-silicon layer (about 3-100 nm thick) is deposited, and the poly-silicon layer is planarized to expose the surface of the gate metal layer 1030 by using, for example, the planarization process such as chemical mechanical polishing (CMP) and etc., whereby forming a first poly-silicon layer 1035, as shown in FIG. 5 (FIG. 5 is a cross-sectional view taken along the line A-A' in FIG. 4a after this step).

The first portion 1022 of the first insulating material layer 1020, the gate insulating material layer 1025, the gate metal layer 1030 and the first poly-silicon layer 1035 serve as a supporting structure in the step of subsequently removing the first portion 1014 of the first layer 1005.

Then there comes the step of forming a gate stack on the top and both sides of the Fin structure 1015.

A second poly-silicon layer 1040 (e.g., about 30-50 nm) is deposited on top of the planarized structure.

Next, a second insulating material layer 1045 is deposited. The material for the second insulating material layer comprises but is not limited to oxide, nitride or the combination thereof, and it preferably is nitride (e.g., $Si_3N_4$ or SiN, the thickness thereof preferably is about 50-120 nm).

Figure 6A:
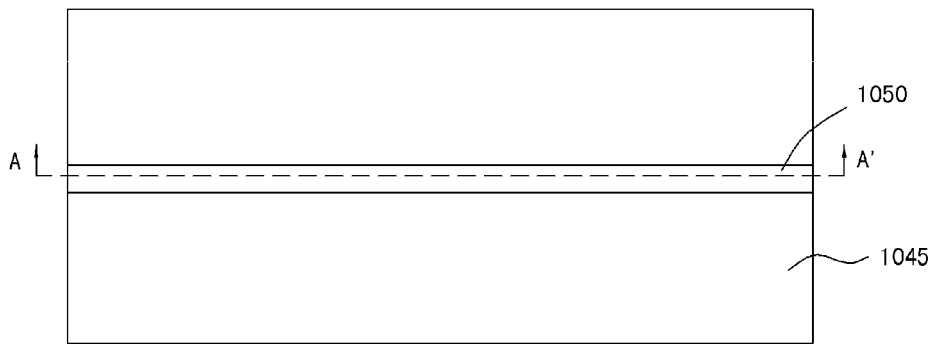
Figure 6B:
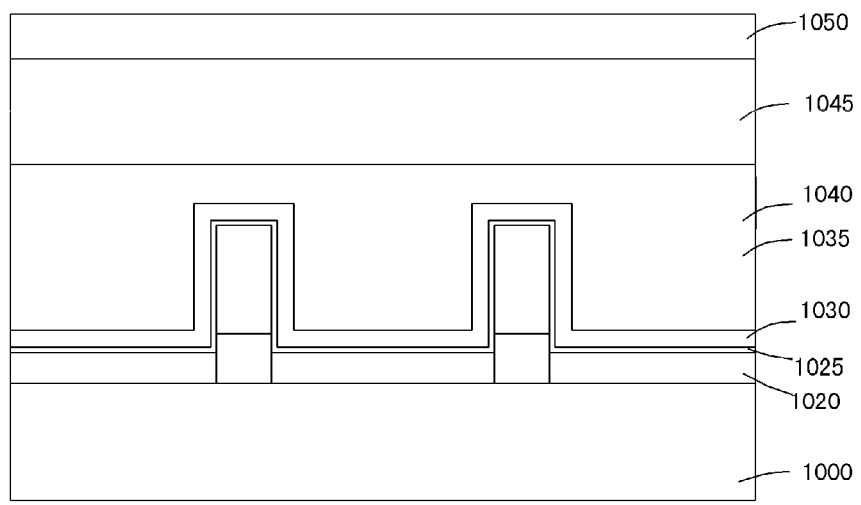

Next, a second photo-resist material layer 1050 is coated and patterned, exposing the second insulating material layer 1045 on both sides of the pre-formed gate stack portion, as shown in the top view of FIG. 6a. The second photo-resist material layer 1050 is patterned for defining a gate stack 1052. FIG. 6b is a cross-sectional view taken along the line A-A' in FIG. 6a.

Figure 7A:
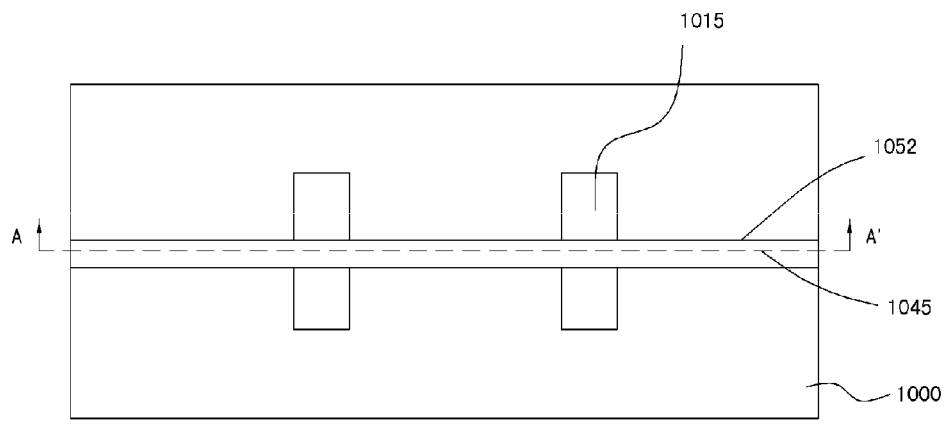
Figure 7B:
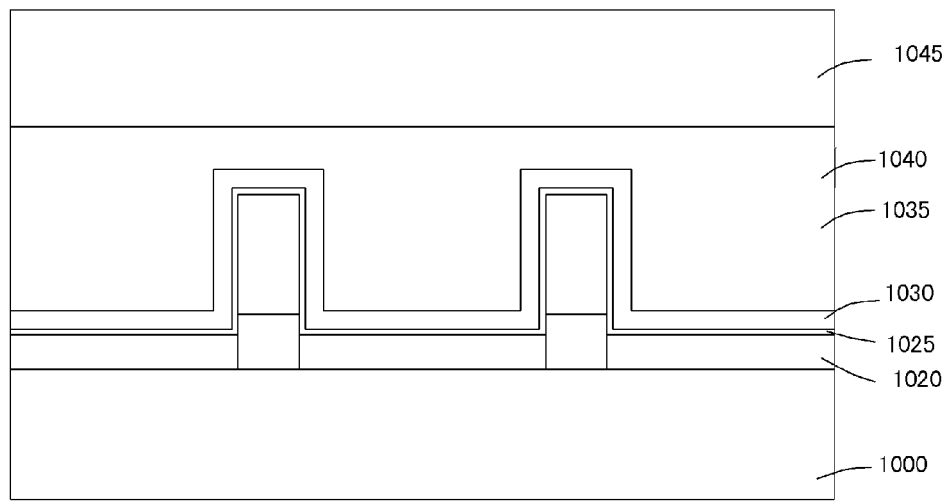

The second insulating material layer 1045, the poly-silicon 1040, 1035, the gate metal layer 1030, the gate insulating material layer 1025 and the first insulating material layer 1020 on both sides of the second photo-resist material layer 1050 are removed sequentially to expose a portion of the semiconductor substrate 1000 and Fin structure 1015, and the photo-resist material layer is removed. The removing process comprises but is not limited to RIE. FIG. 7a is the top view after this step. At the time, the structure beneath the second photo-resist material layer 1050 is not influenced, the structure as shown in FIG. 7b (which is a cross-sectional view taken along the line A-A') is still maintained.

Figure 8A:
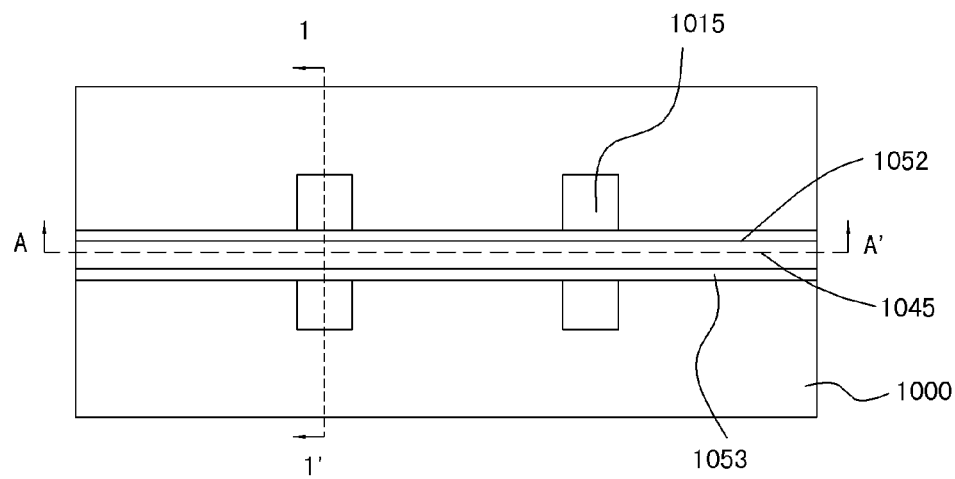
Figure 8B:
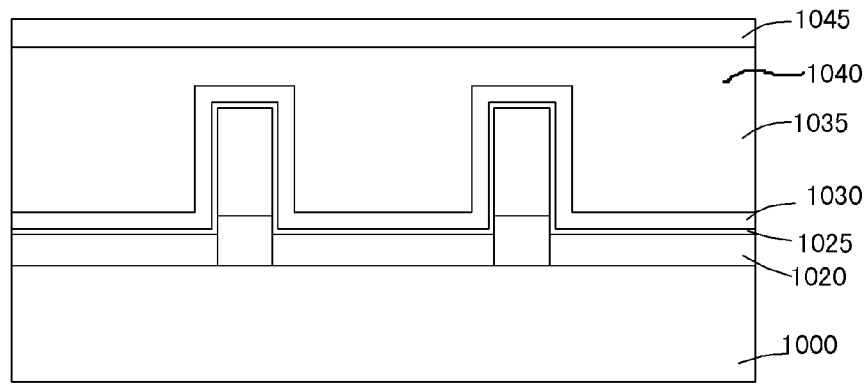
Figure 8C:
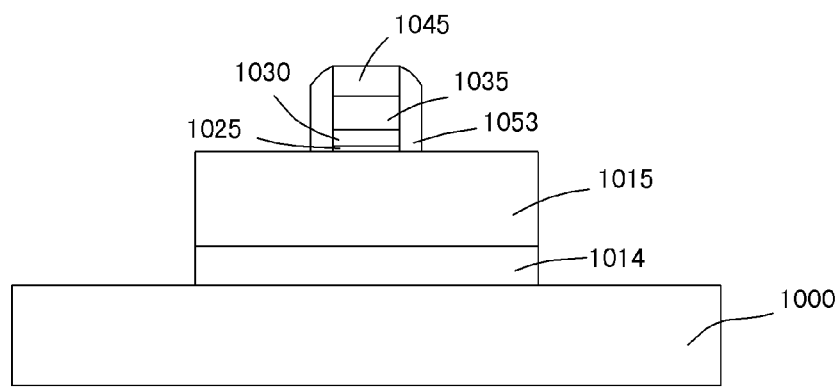

A spacer 1053 is formed on both sides of the gate stack 1052, but the surface of the Fin structure 1015 on both sides is exposed. The spacer may be formed by depositing a third insulating material layer (preferably a nitride, e.g., $Si_3N_4$ or SiN) and by etching with, e.g., the RIE technique. This is as shown in FIG. 8a (which is the top view of the structure formed after this step), FIG. 8b is a cross-sectional view taken along the line A-A' in FIG. 8a, and FIG. 8c is a cross-sectional view taken along the line 1-1' in FIG. 8a.

Figure 9A:
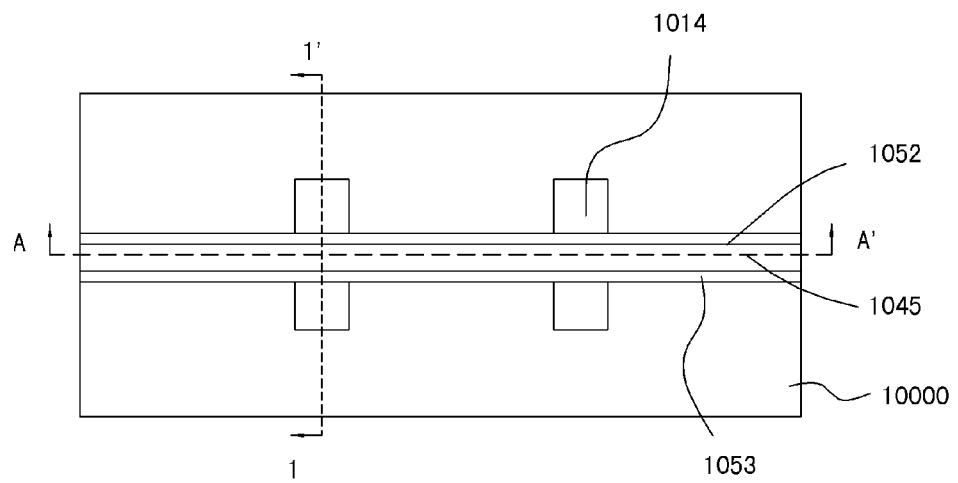
Figure 9B:
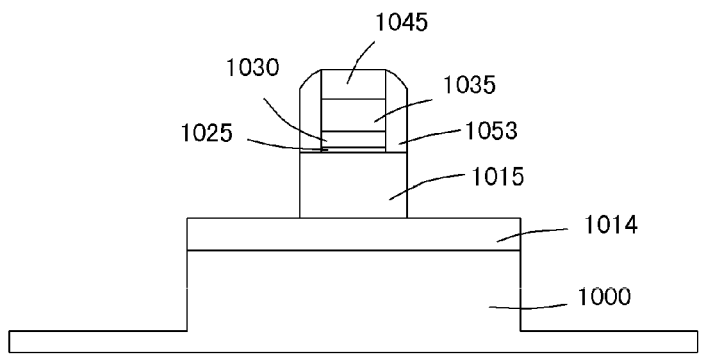

A portion of the Fin structure (which is, e.g., a Si Fin in an embodiment) 1015 on both sides of the spacer 1053 is removed, the removing process comprises but is not limited to selective etching, the etching stops at the surface of the first portion 1014 of the first layer. FIG. 9a is the top view of the structure after this step, and FIG. 9b is a cross-sectional view taken along the line 1-1' in FIG. 9a. At the time, since the substrate and the Fin structure are of the same material, the substrate is etched for a certain thickness. In another embodiment, a mask may be used to prevent the substrate from being etched.

Figure 10:
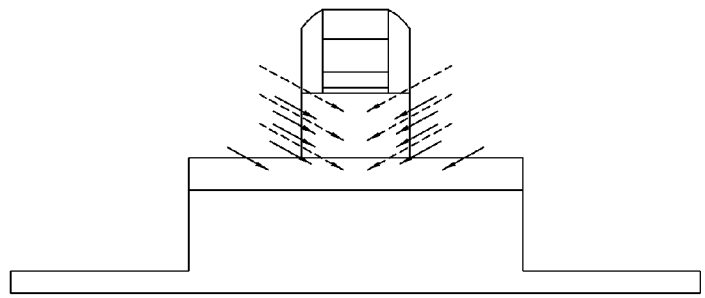

Next, as shown in FIG. 10, extension implantation (shown by the solid arrow in the Figure) and angle halo implantation (shown by the dotted arrow in the Figure) are implemented in the kept Fin structure such that source and drain extension regions and halo implantation regions are formed in the Fin structure. Preferably, for an NFET, to form halo implantation regions, the ion used in the angle halo implantation may be B or $BF_2$, and the ion used in the extension implantation may be As or P; for a PFET, to form halo implantation regions, the ion used in the angle halo implantation may be As or P, and the ion used in the extension implantation may be B or $BF_2$.

Figure 11A:
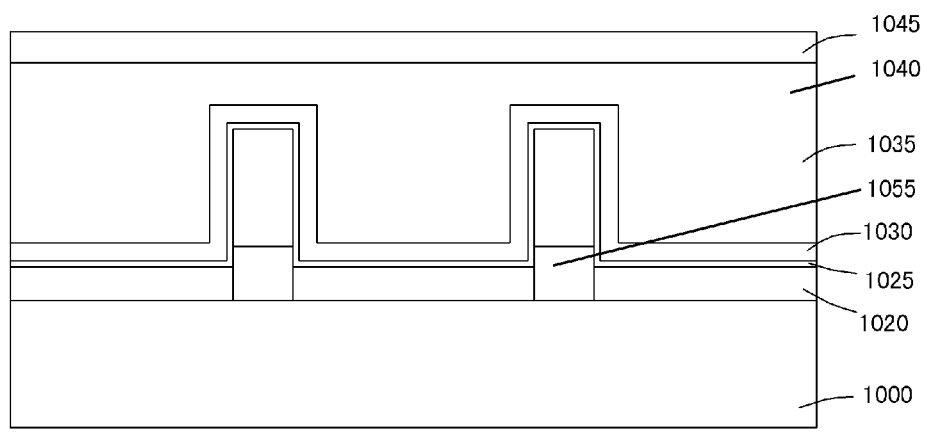
Figure 11B:
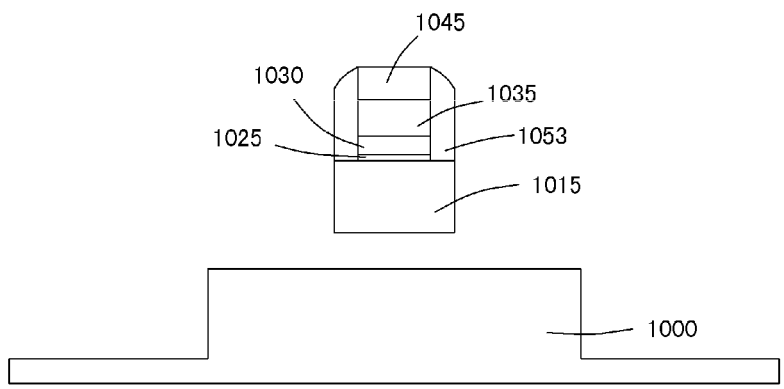

The first portion 1014 of the first layer is removed, the removing process comprises but is not limited to selectively etching the first portion 1014 of the first layer. In an embodiment, the removing is implemented by using an etching technique that is selective to Si and SiGe 1014. The removing process employs RIE etching or isotopic wet etching, wherein the corrosive agent of the wet etching comprises but is not limited to Potassium hydroxide (KOH), Tetramethylammonium hydroxide (TMAH), Ethylenediamine pyrocatechol (EDP) or combinations thereof. FIG. 11a is a cross-sectional view of the structure taken along the line A-A' in FIG. 9a after this step, FIG. 11b is a cross-sectional view taken along the line 1-1' in FIG. 9a, wherein the removed first portion 1014 of the first layer forms a void 1055, which has an upper border defined by the lower surface of the Fin structure 1015 and lower border defined by a portion of the upper surface of the semiconductor substrate 1000.

Figure 12A:
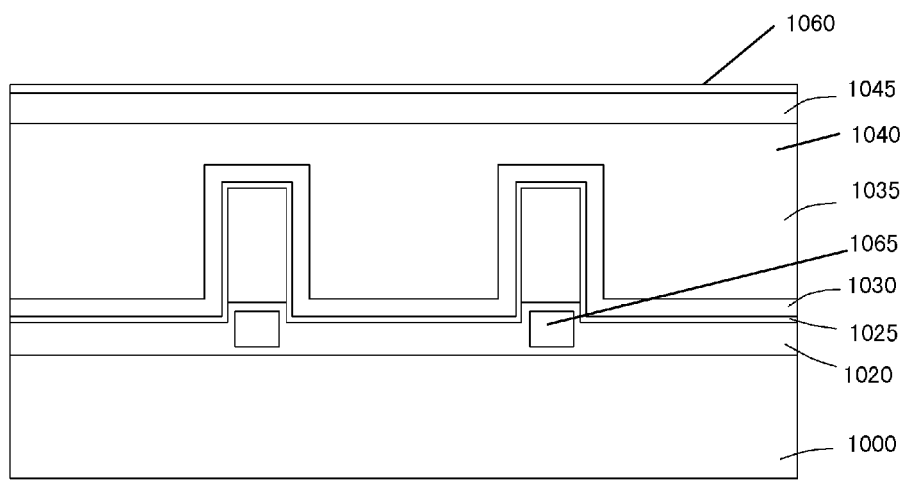
Figure 12B:
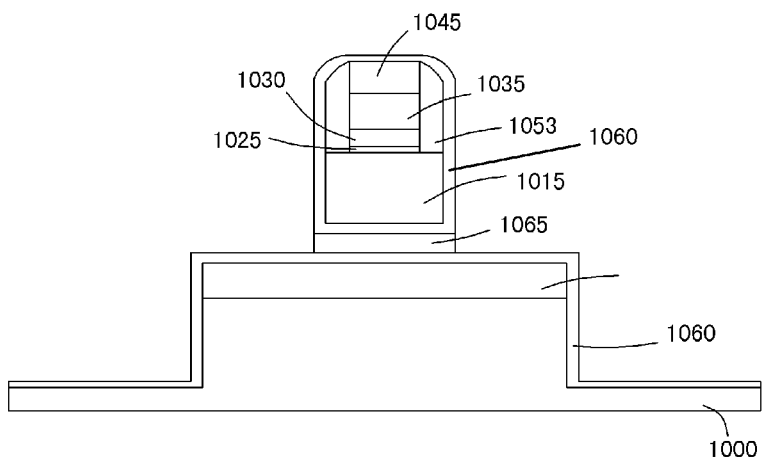

A fourth insulating material layer 1060 (e.g., an oxide, which is 3-10 nm thick) and a fifth insulating material layer 1065 (e.g., a nitride, which is 10-20 nm thick) different from the fourth insulating material layer 1060 are sequentially deposited, then the fifth insulating material layer 1065 is etched with the thin oxide layer and the gate stack as a mask, the fifth insulating material layer 1065 under the mask is kepted, at the time, the void 1055 is filled with the fifth insulating material layer 1065, constituting an insulator. The formed structure is as shown in FIG. 12, wherein FIG. 12a is a cross-sectional view taken along the line A-A' in FIG. 9a after this step, and FIG. 12b is a cross-sectional view taken along the line 1-1' in FIG. 9a after this step.

Portions of the fourth insulating material layer 1060 that are not under the Fin structure 1015 are removed, including a portion of the fourth insulating material layer on the sides of the Fin structure and a portion of the fourth insulating material layer on the substrate 1000 and not under the Fin structure. At the time, the remaining fourth insulating material layer only remains on the lower surface of the Fin structure and the upper surface of a portion of the substrate that is opposite thereto.

Figure 13A:
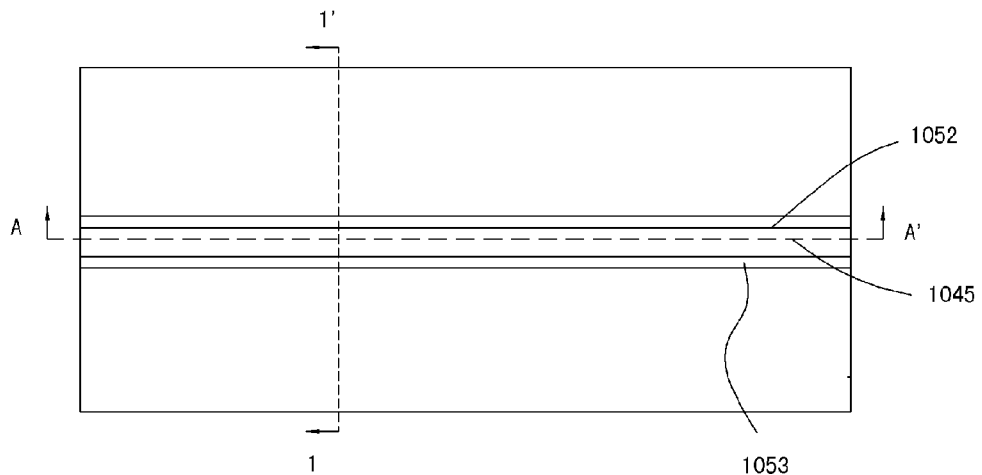
Figure 13B:
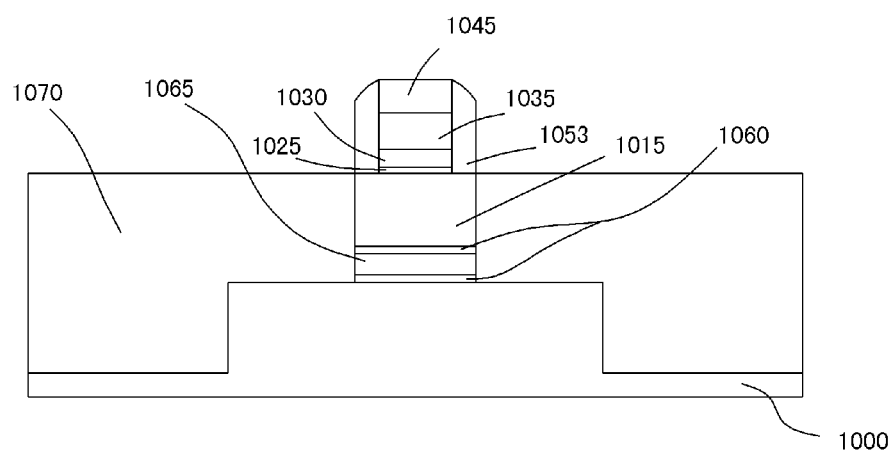

A stressed material 1070 that is for enhancing carrier mobility of the channel for the manufactured transistor type is selectively epitaxially grown on the semiconductor substrate on both sides of the Fin structure and the insulator. For example, for a PFET, a stressed material having compressive stress is selectively epitaxially grown. More specifically, for a Si-based PFET, SiGe is selectively epitaxially grown (wherein, preferably, Ge % is about 15-60%, having compressive stress), wherein in-situ B doping (the concentration of B is about $1\times10^9$-$3\times10^{20}/cm^3$) further may be implemented. For an NFET, a stressed material having tensile stress is selectively epitaxially grown. More specifically, for a Si-based NFET, Si:C (C % is about 0.3-2%, having tensile stress) is selectively epitaxially grown, wherein in-situ P doping (the concentration of P is about $1\times10^9$-$2\times10^{21}/cm^3$) further may be implemented. The stressed material 1070 constitutes source and drain regions (S/D). Such source and drain regions may provide stress to the channel; besides, since it is disposed on the entire semiconductor substrate on both sides of the gate stack, the area of the S/D is increased compared to a common S/D, thus the source/drain resistance is reduced; besides, source and drain regions have spacing regions 1060 and 1065 therebetween, thus the sub-threshold leakage is effectively controlled, and the SCE (Short Channel Effect) is reduced. Meanwhile, the insulator 1065 further increases the distance between the gate and the source/drain, which reduces the parasitic capacitance. Besides, since the substrate is further etched in FIGS. 9a and 9b, the source and drain regions (S/D) are embedded into the substrate, thus the stress of the source and drain regions may be further increased, which largely enhances the carrier mobility in the channel region. FIG. 13a is the top view, and FIG. 13b is a cross-sectional view taken along the line 1-1'. In another implementation, if, in the step corresponding to FIG. 9, a mask is used to prevent the substrate from being etched, the substrate may be further etched downwards before the source and drain regions are epitaxially grown such that the source and drain regions are embedded in the substrate.

Figure 14A:
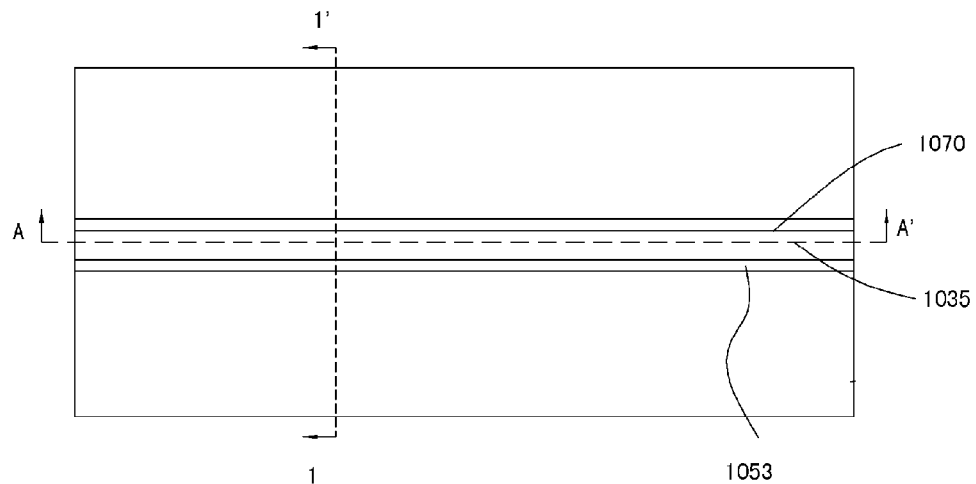
Figure 14B:
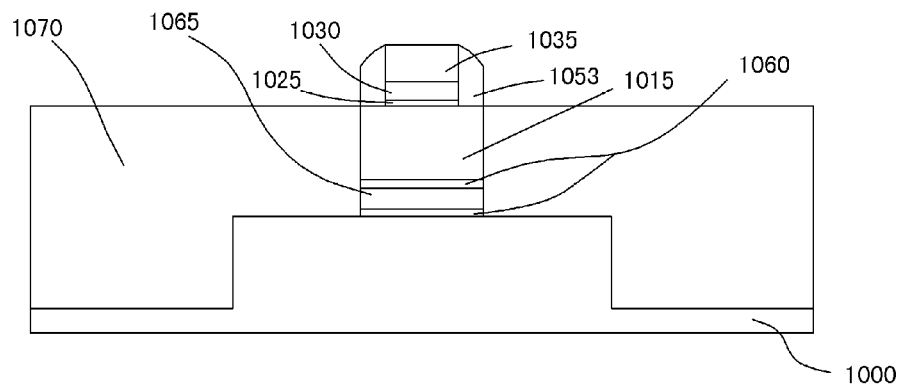

The poly-silicon 1035 and 1040 in the gate stack are exposed. The exposing process, for example, is etching the spacer 1053 and the second insulating material layer 1045 in the gate stack by means of the RIE technique. FIG. 14a is the top view, and FIG. 14b is a cross-sectional view taken along the line 1-1' in FIG. 14a.

Next, in order to make the outer side of the device insulated, the following steps are performed.

Figure 15A:
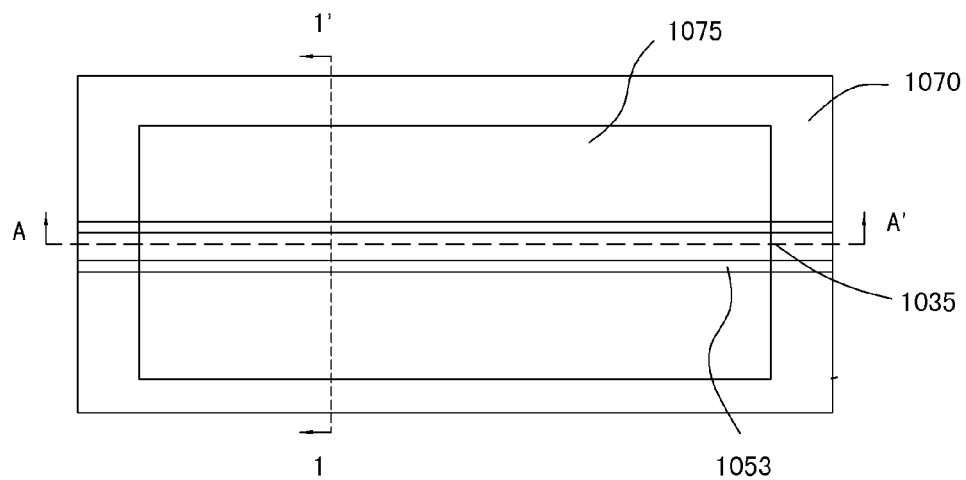
Figure 15B:
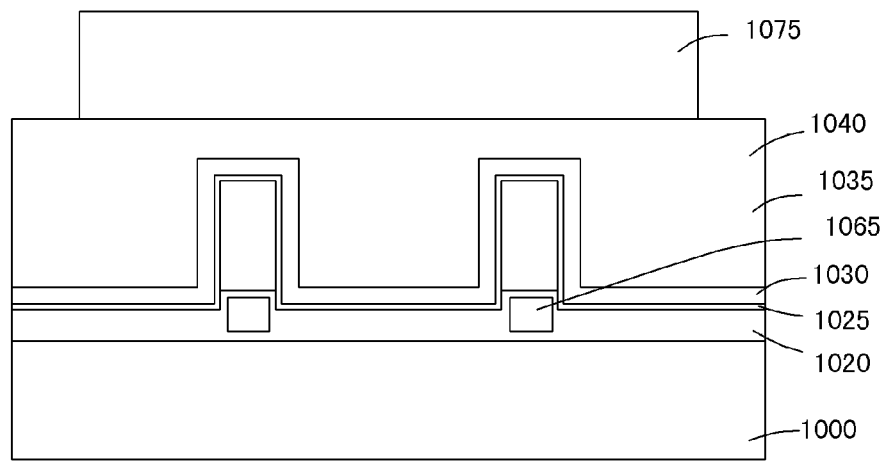
Figure 15C:
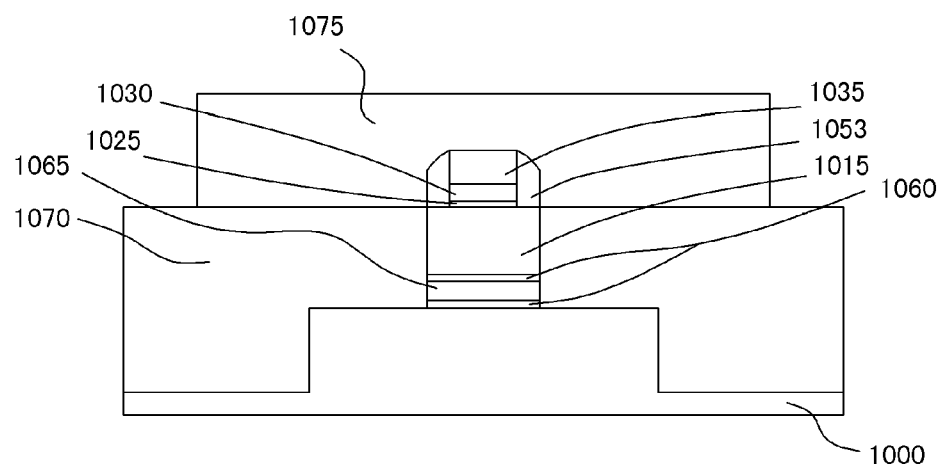

The third photo-resist material layer is coated and patterned, forming a pattern 1075 as shown in the top view of FIG. 15a, FIG. 15b is a cross-sectional view taken along the line A-A' in FIG. 14a after this step, FIG. 15c is a cross-sectional view taken along the line 1-1' in FIG. 14a after this step.

Figure 16A:
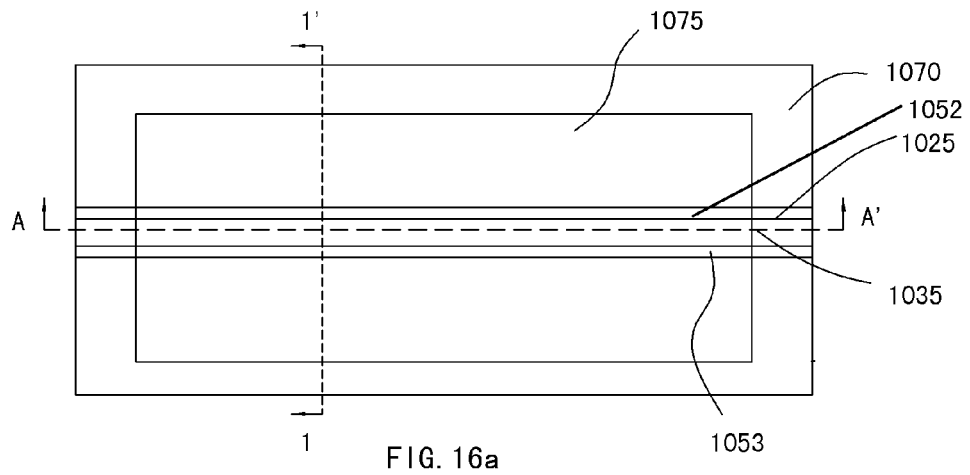
Figure 16B:
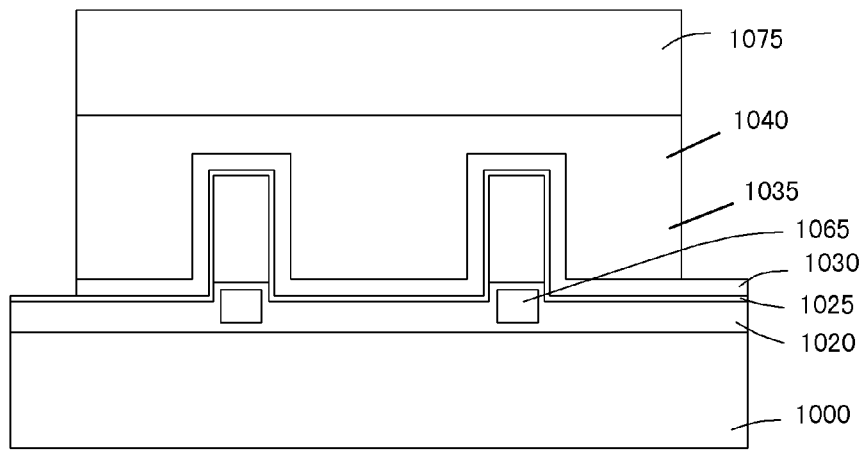
Figure 16C:
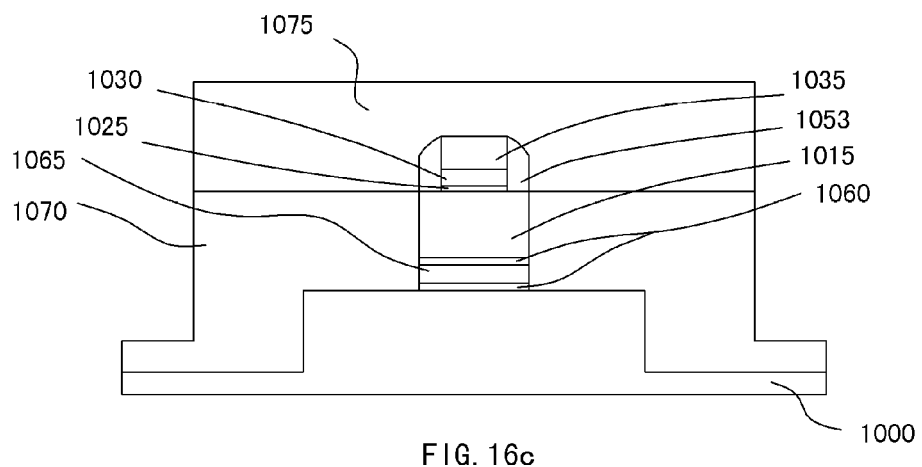

A Portion of the stressed material 1070, a portion of the second insulating material layer 1045, portions of the poly-silicon 1040, 1035, and a portion of the gate metal layer 1030 that are not masked by the third photo-resist material layer are removed, thus a portion of the gate insulating material layer 1025 is exposed. The removing process comprises but is not limited to the RIE technique. FIG. 16 is the top view of the structure obtained after this step, FIG. 16b is a cross-sectional view taken along the line A-A', and FIG. 16c is a cross-sectional view taken along the line 1-1'.

Figure 17A:
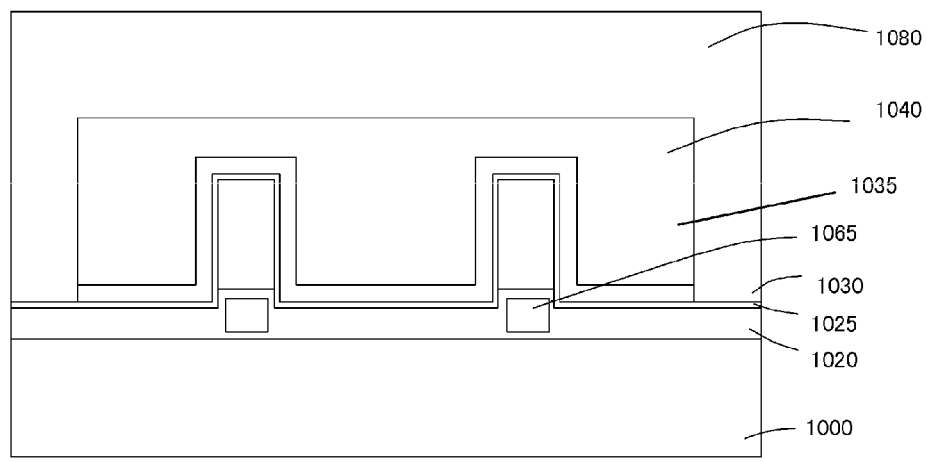
Figure 17B:
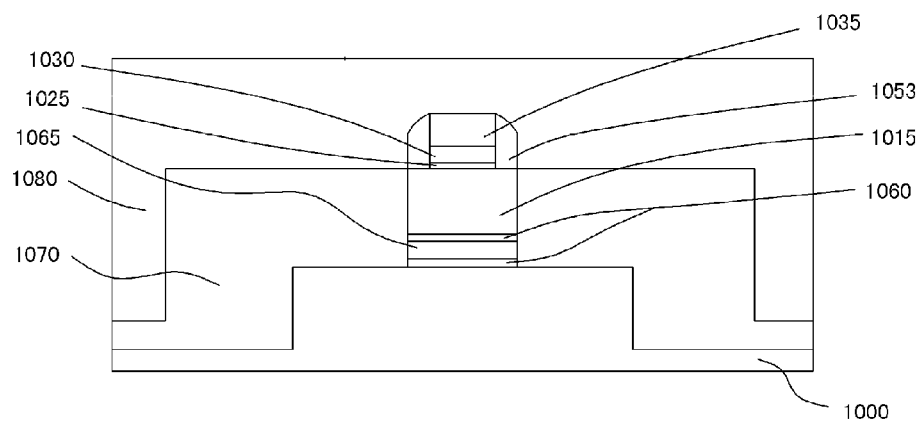

The third photo-resist material layer is removed, a sixth insulating material layer 1080 (e.g., an oxide) is deposited and CMP is implemented thereto. FIG. 17a is a cross-sectional view of the structure obtained after this step which is taken along the line A-A' in FIG. 16a, FIG. 17b is a cross-sectional view taken along the line 1-1'. It can be seen from FIGS. 17a and 17b that the sixth insulating material layer 1080 covers the entire structure.

Figure 18A:
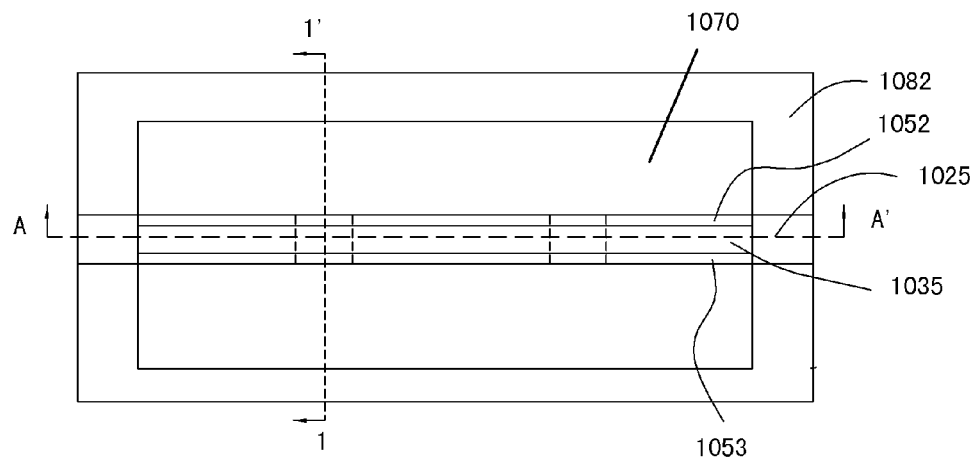
Figure 18B:
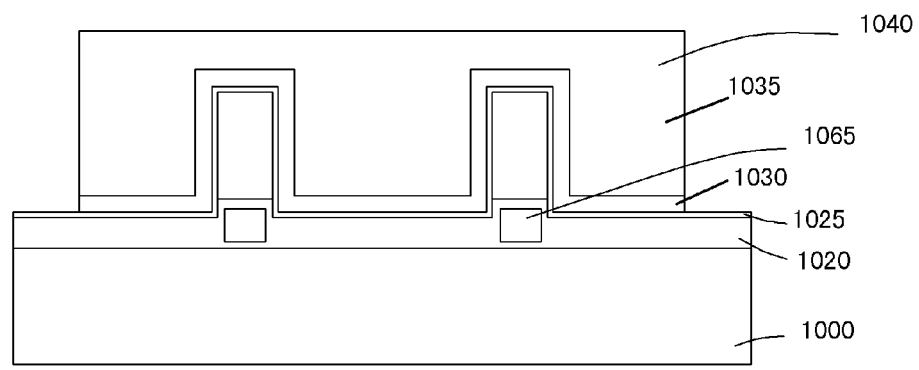
Figure 18C:
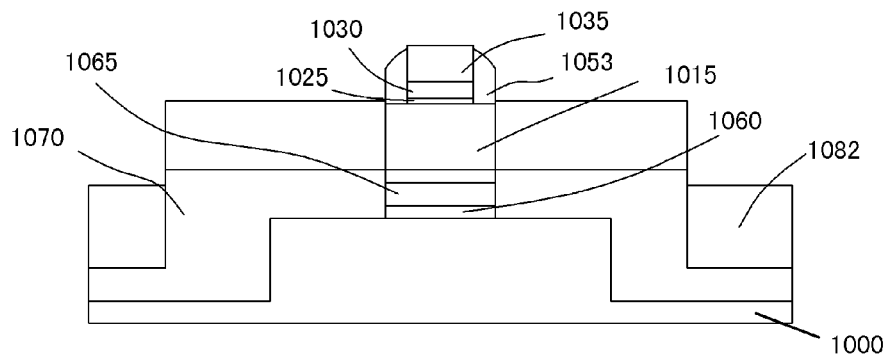

A portion of the sixth insulating material layer 1080 is removed by means of, for example, the RIE technique. FIG. 18a is the top view of the structure obtained after this step, FIG. 18b is a cross-sectional view taken along the line A-A', and FIG. 18c is a cross-sectional view taken along the line 1-1'. It can be easily seen from FIG. 18b that the formed sixth insulating material layer is completely removed, and it can be seen from FIG. 18c that a remaining portion 1082 of the sixth insulating material layer 1080 still exist on both sides of the stressed material 1070 due to the deposition depth, whereby forming outer-side insulation. In another embodiment, the remaining portion 1082 may not be maintained either.

Figure 19A:
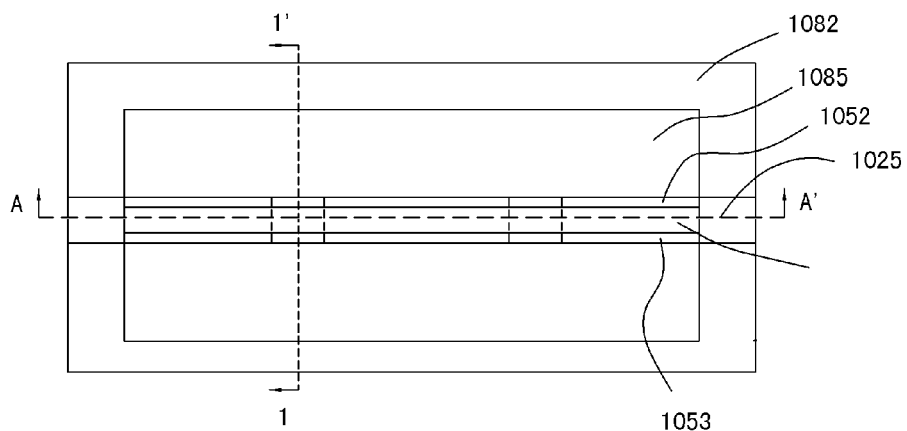
Figure 19B:
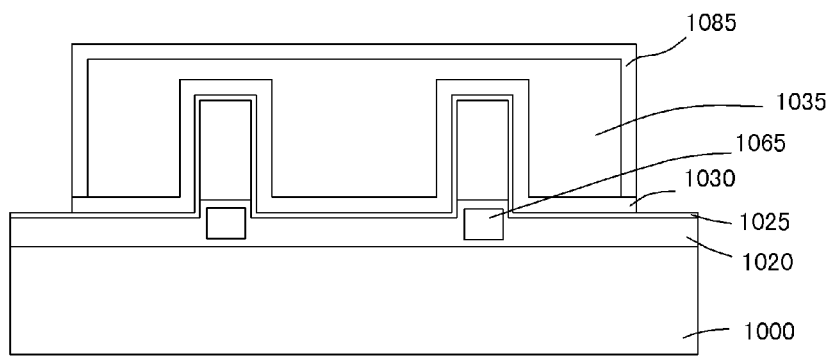
Figure 19C:
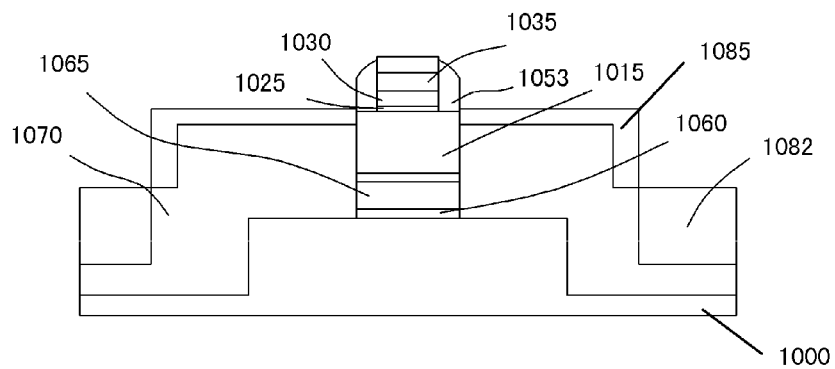

Next, as shown in FIG. 19, a conventional process is implemented, a silicide 1085 is formed on the source and drain regions. Optionally, the silicide also may be formed on top of the gate stack. Specifically, first, as shown in FIG. 19a, a metal layer is deposited. The metal layer comprises metal material selected from a group consisting of Ni, Co, Ti, W, Pt, Ir, in this embodiment, Ni is preferable, its thickness may be 5-15 nm. Then, annealing is implemented, for example, at the temperature of 300-500° C., so as to make the poly-silicon 1035 and the stressed material 1070 react with Ni, and the Ni that does not react is wet etched, forming a silicide. FIG. 19b is a cross-sectional view taken along the line A-A', and FIG. 19c is a cross-sectional view taken along the line 1-1'.

Next, contacts are formed and are metalized to form an interconnection structure to extract electrodes, the metalizing formation may refer to conventional technique and herein we will not go further on it. Up to this point, the making of the FinFET of the invention is completed.

Although the invention is illustrated only with reference to the embodiments above, those having ordinary skill in the art shall appreciate that based on the Fin structure of the invention, various Fin Field-Effect Transistor structures, for example, double-gate FinFETs, triple-gate FinFETs and etc., may be made, rather than being limited to the structure shown in the invention.

In the discussion above, the technical details of patterning, etching and etc. for each layer is not elaborated. However, those having ordinary skill in the art shall appreciate that layers, regions and etc. of desired shapes may be formed by various means in the prior art. In addition, in order to form a same structure, those having ordinary skill in the art further may design methods that are not identical to the method discussed above. Illustration is made upon the invention with reference to the embodiment of the invention. However, the embodiment is only for the purpose of illustration, rather than for limiting the scope of the invention. The scope of the invention is limited by the appended claims and their equivalents. Those having ordinary skill in the art may make various substitution and modification without departing from the scope of the invention, these substitution and modification shall fall within the scope of the invention.

The invention claimed is:

1. A semiconductor structure, comprising:
   a semiconductor substrate;
   an insulator formed on the semiconductor substrate;
   a Fin structure formed over the insulator;
   a gate stack and a spacer surrounding the gate stack, which are formed over the Fin structure; and
   source and drain regions, located on both sides of the Fin structure and the insulator,
   wherein the source and drain regions are formed by a stressed material for enhancing carrier mobility of the channel.

2. The semiconductor structure according to claim 1, wherein the source and drain regions are embedded in the substrate.

3. The semiconductor structure according to claim 1, wherein the side surfaces of the spacer align with the side surfaces of the Fin structure.

4. The semiconductor structure according to claim 1, wherein if the semiconductor structure is a Si-based PFET, the stressed material is SiGe; and if the semiconductor structure is a Si-based NFET, the stressed material is Si: C.

5. The semiconductor structure according to claim 1, further comprising source and drain extension regions and halo implantation regions, which are formed in the Fin structure.

6. The semiconductor structure according to claim 1, further comprising a silicide formed on the source and drain regions.

7. The semiconductor structure according to claim 1, wherein the insulator is formed of a nitride.

8. The semiconductor structure according to claim 1, wherein the semiconductor substrate is a bulk Si substrate.

* * * * *